United States Patent
Sandhu et al.

(10) Patent No.: US 10,396,082 B2
(45) Date of Patent: Aug. 27, 2019

(54) MEMORY CELLS HAVING A CONTROLLED-CONDUCTIVITY REGION

(71) Applicant: Micron Technology, Inc., Boise, ID (US)

(72) Inventors: Gurtej S. Sandhu, Boise, ID (US); Kamal M. Karda, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 21 days.

(21) Appl. No.: 15/642,148

(22) Filed: Jul. 5, 2017

(65) Prior Publication Data

US 2019/0013319 A1 Jan. 10, 2019

(51) Int. Cl.
*H01L 27/108* (2006.01)

(52) U.S. Cl.
CPC .. *H01L 27/10805* (2013.01); *H01L 27/10823* (2013.01); *H01L 27/10826* (2013.01); *H01L 27/10876* (2013.01); *H01L 27/10879* (2013.01)

(58) Field of Classification Search
CPC ......... H01L 27/10805; H01L 27/10823; H01L 27/10826; H01L 27/2409; H01L 27/2463; H01L 27/10873; H01L 27/10876; H01L 29/7391; H01L 29/4236
See application file for complete search history.

(56) References Cited

U.S. PATENT DOCUMENTS

| | | | | |
|---|---|---|---|---|
| 4,130,895 A * | 12/1978 | Zibert | ................... | G11C 11/404 257/E27.084 |
| 4,641,165 A * | 2/1987 | Iizuka | ............... | H01L 27/10805 257/297 |
| 5,023,682 A * | 6/1991 | Shimizu | ............ | H01L 27/10805 257/297 |
| 5,257,225 A * | 10/1993 | Lee | ......... | G11C 17/16 365/185.17 |
| 5,408,430 A * | 4/1995 | Shimoji | ................. | G11C 16/14 365/185.06 |
| 6,512,547 B1 * | 1/2003 | Miida | ............... | H01L 27/14609 250/208.1 |
| 6,961,277 B2 * | 11/2005 | Moore | .................. | G11C 11/406 365/185.18 |
| 7,372,719 B2 * | 5/2008 | Zimmermann | .......... | G11C 7/12 365/149 |
| 9,263,675 B2 | 2/2016 | Ramaswamy | | |
| 9,812,203 B2 * | 11/2017 | Widjaja | .................. | G11C 11/14 |

(Continued)

*Primary Examiner* — Khiem D Nguyen
(74) *Attorney, Agent, or Firm* — Wells St. John P.S.

(57) ABSTRACT

Some embodiments include a memory cell having a transistor with a channel region between a first source/drain region and a second source/drain region. A controlled-conductivity region is adjacent the first source/drain region. The controlled-conductivity region has a low-conductivity mode and a high-conductivity mode. The high-conductivity mode has a conductivity at least $10^6$ greater than a conductivity of the low-conductivity mode. The channel region includes a first material having a first bandgap, and the controlled-conductivity region includes a second material having a second bandgap which is greater than the first bandgap. A charge-storage device is electrically coupled to the first source/drain region through the controlled-conductivity region. A bitline is electrically coupled to the second source/drain region.

17 Claims, 12 Drawing Sheets

(56) References Cited

U.S. PATENT DOCUMENTS

| | | | |
|---|---|---|---|
| 2004/0160830 A1* | 8/2004 | Forbes | G11C 11/404 365/185.28 |
| 2005/0239252 A1* | 10/2005 | Ahn | H01L 21/823412 438/268 |
| 2006/0097345 A1* | 5/2006 | Marr | G11C 17/16 257/530 |
| 2015/0236259 A1* | 8/2015 | Ramaswamy | H01L 45/1266 257/4 |
| 2015/0340372 A1* | 11/2015 | Pandey | H01L 27/1159 257/295 |
| 2018/0062075 A1* | 3/2018 | Jo | H01L 45/145 |

* cited by examiner

MEMORY CELLS HAVING A CONTROLLED-CONDUCTIVITY REGION

TECHNICAL FIELD

Memory cells; such as, for example, dynamic random access memory (DRAM) cells.

BACKGROUND

Memory is one type of integrated circuitry, and is used in systems for storing data. Memory is usually fabricated in one or more arrays of individual memory cells. The memory cells are configured to retain or store information in at least two different selectable states. In a binary system, the states are considered as either a "0" or a "1". In other systems, at least some individual memory cells may be configured to store more than two levels or states of information.

Dynamic random access memory (DRAM) is one type of memory, and is utilized in numerous electronic systems. A DRAM cell may comprise a transistor in combination with a charge storage device (for instance, a capacitor). DRAM has an advantage of having rapid read/write; but may be highly volatile (often requiring refresh of several hundreds of times per second). The volatility of DRAM cells may be expressed as the retention time of the DRAM cells. Cells having longer retention times may operate with lower refresh rates as compared to cells with shorter retention times. Lower refresh rates may advantageously reduce power consumption. Modern electronic devices may operate under battery power, and reduced power consumption may lead to improved battery life.

Integrated circuit fabrication continues to strive to produce smaller and denser integrated circuits. Difficulties are encountered as devices are scaled to increasingly smaller dimensions. For instance, even minor structural variations across an array of small-dimension devices may lead to vast differences in performance characteristics of the devices across the array. One of the important performance characteristics of DRAM cells is the retention time. The memory cells across a DRAM array may have different retention times relative to one another. Memory cells having retention times shorter than a preset threshold may be disconnected from the memory array through antifuses or other mechanisms so that they do not influence the overall performance of the memory array. However, even after such memory cells are disconnected, there may still be a substantial variation of retention times across the remaining memory cells within the DRAM array. The refresh rate for the array will be determined by the remaining memory cells having the shortest retention times (i.e., by the worst-performing memory cells remaining in the array). It would be desirable to improve the retention times of the worst-performing memory cells remaining in the array in order to improve (i.e., reduce) the overall refresh rate for the memory array.

Another problem that may occur is that it may be difficult to accurately identify the poor-performing memory cells of a memory array with present testing. Specifically, some memory cells may appear normal under testing conditions, but will then be found to perform to below-normal tolerances under actual use. This may be due defects (for instance, dangling bonds) being cloaked under the conditions of the testing environment (e.g., a dangling bond may be cloaked by having a charge carrier in close proximity to conceal the electrical properties of the dangling bond), and then becoming de-cloaked and problematic under the conditions of actual use (e.g., a charge carrier may migrate away from a dangling bond to reveal the problematic electrical properties of the dangling bond). It would be desirable to develop improved memory cells having electrical properties (e.g., retention times) that consistently carry over from testing regimes to actual use regimes.

DETAILED DESCRIPTION OF THE ILLUSTRATED EMBODIMENTS

Some embodiments include memory cells having controlled-conductivity regions between transistor source/drain regions and charge-storage devices. The controlled-conductivity regions may have low-conductivity modes and high-conductivity modes, with the conductivity across a controlled-conductivity region in the high-conductivity mode being at least 1000 times greater than the conductivity across the controlled-conductivity region in the low-conductivity mode. In some embodiments, the controlled-conductivity regions may be formed to improved uniformity as compared to other components of the memory cells, and thus may be utilized to smooth out performance characteristics across an array of memory cells. In some embodiments, the controlled-conductivity regions may be utilized to improve retention times of memory cells having below-average retention time within a memory array, and may thus improve the overall retention time of the memory array. Example embodiments are described below with reference to FIGS. 1-15.

Figure 1:
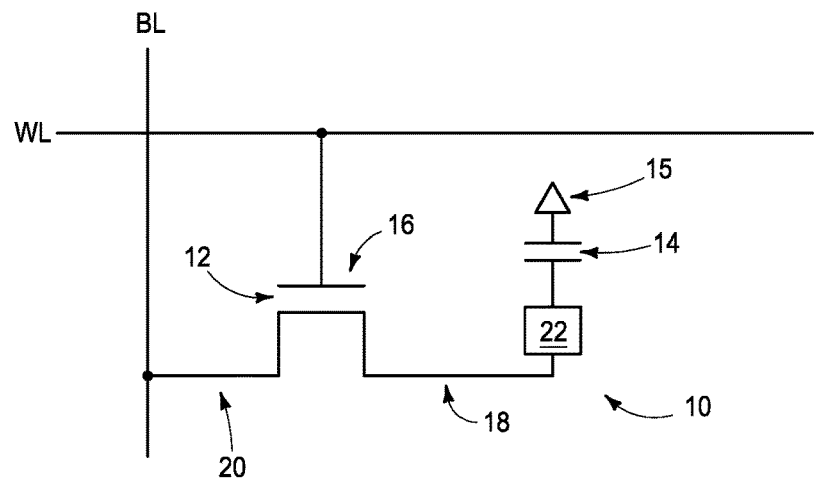
FIGS. 1-3 are diagrammatic schematic views of example memory cells.

Referring to FIG. 1, an example memory cell 10 is schematically illustrated. The memory cell 10 includes a transistor 12 electrically coupled with a charge-storage device 14.

The charge-storage device 14 may correspond to any suitable device which reversibly stores charge, and in the illustrated example is a capacitor. In the shown embodiment, the capacitor 14 has a plate electrically coupled with a reference voltage 15. The reference voltage may be ground, or any other suitable voltage, including, for example, a so-called "common plate" (CP) voltage. The common plate voltage may be, for example, within a range of from greater than or equal to ground to less than or equal to a power supply voltage VCC (i.e., ground≤CP≤VCC). In some applications the common plate voltage is about one-half VCC (i.e., about VCC/2).

The transistor 12 includes a gate 16 and a pair of source/drain regions 18 and 20. In some embodiments, the source/drain region 18 may be referred to as a first source/drain region, and the source/drain region 20 may be referred to as a second source/drain region.

The first source/drain region 18 is connected to the capacitor 14 through a controlled-conductivity region 22.

The controlled-conductivity region 22 has a high-conductivity mode and a low-conductivity mode, with the high-conductivity mode having a conductivity which is greater than a conductivity of the low-conductivity mode by at least about $10^3$. In some embodiments, the conductivity of the high-conductivity mode may be greater than the conductivity of the low-conductivity mode by at least about $10^6$, at least about $10^9$, at least about $10^{12}$, etc. The controlled-conductivity region 22 comprises a material which may be selectively switched from the low-conductivity mode to the high-conductivity mode by altering one or more properties of the material and/or of the environment of the material. For instance, the material may be switched from the low-conductivity mode to the high-conductivity mode by altering a temperature of the material, an electric field passing into the material, a phase of the material, an ionization state of the material, etc.

In some example embodiments, the material within the controlled-conductivity region 22 may include one or more of silicon, silicon carbide, chalcogenide, tungsten sulfide, tungsten silicide, molybdenum silicide, molybdenum sulfide, and indium gallium zinc oxide.

The second source/drain region 20 of transistor 12 is electrically coupled with a bitline (BL) (i.e., digit line, sense line), and the gate 16 of transistor 12 is electrically coupled with a wordline (WL) (i.e., access line). The memory cell 10 may be selectively addressed for read/write operations utilizing the wordline WL and the bitline BL.

Figure 2:
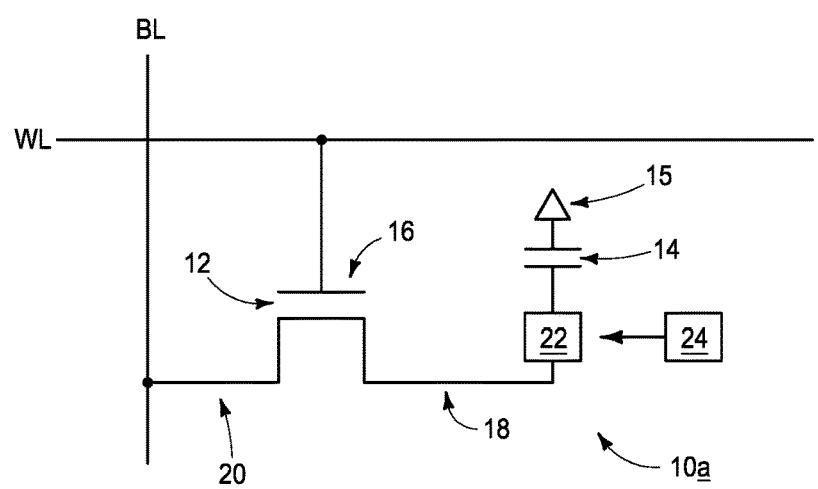

In some applications, additional circuitry may be provided to switch the controlled-conductivity region 22 from the low-conductivity mode to the high-conductivity mode, and vice versa. For instance, FIG. 2 shows a memory cell 10a having additional circuitry 24 proximate the controlled-conductivity region 22. The additional circuitry 24 may be utilized to alter one or more properties of the material within controlled-conductivity region 22 and/or to alter an environment of the material within the controlled-conductivity region 22. For instance, the additional circuitry 24 may be utilized to alter an electric field passing into or through the controlled-conductivity region 22, to alter a temperature of the controlled-conductivity region 22, etc.

Figure 3:
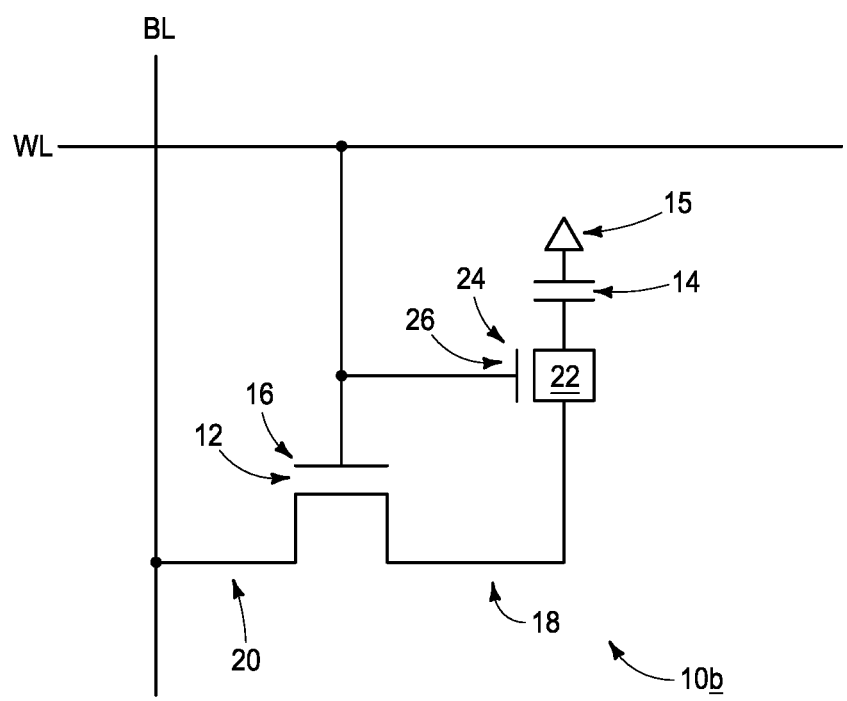

In some embodiments, the additional circuitry 24 may correspond to gating circuitry electrically coupled with the gate 16 of transistor 12. For instance, FIG. 3 shows a memory cell 10b in which the additional circuitry 24 is a gate 26 electrically coupled with the gate 16 of transistor 12, and electrically coupled with the wordline WL. The gate 26 may be utilized to alter an electric field passing into the material of controlled-conductivity region 22. For instance, in some embodiments the memory cell 10b may be operated by increasing a voltage along the wordline WL until a sufficient electric field is established by gate 16 to enable current to pass between source/drain regions 18 and 20. Such voltage will also enable gate 26 to establish a sufficient electric field to transition the controlled-conductivity region 22 from a low-conductivity mode to a high-conductivity mode, and thereby enable high conductivity access between source/drain region 18 and charge-storage device 14. In some embodiments, the voltage on gate 26 which is suitable for transitioning the controlled-conductivity region 22 from the low-conductivity mode to the high-conductivity mode will be less than or equal to about 5 volts (V), less than or equal to about 3 V, less than or equal to about 1 V, less than or equal to 50 millivolts (mV), etc. Alternatively considered, the voltage provided proximate the controlled-conductivity region 22 and suitable for inducing sufficient electric field into the controlled-conductivity region 22 to transition between the high-conductivity mode and the low-conductivity mode may be less than or equal to about 5 V, less than or equal to about 3 V, less than or equal to about 1 V, less than or equal to 50 millivolts (mV), etc.

The controlled-conductivity region 22 may enable improved isolation of charge-storage device 14 from source/drain region 18 when wordline WL is in a low-voltage state (i.e., may reduce leakage from the charge-storage device 14 to the source/drain region 18 when the wordline WL is in the low-voltage state), which may improve a retention time of a memory cell as compared to conventional memory cells lacking controlled-conductivity regions. Additionally, the controlled-conductivity region 22 may enable high current flow between the charge-storage device 14 and the source/drain region 18 when the wordline WL is in the high-voltage state (e.g., when memory cell 10b is accessed for a read/write operation).

Any suitable memory cell architectures may be utilized as the memory cells described schematically with reference to FIGS. 1-3. Example memory cell architectures are described with reference to FIGS. 4-13.

Figure 4:
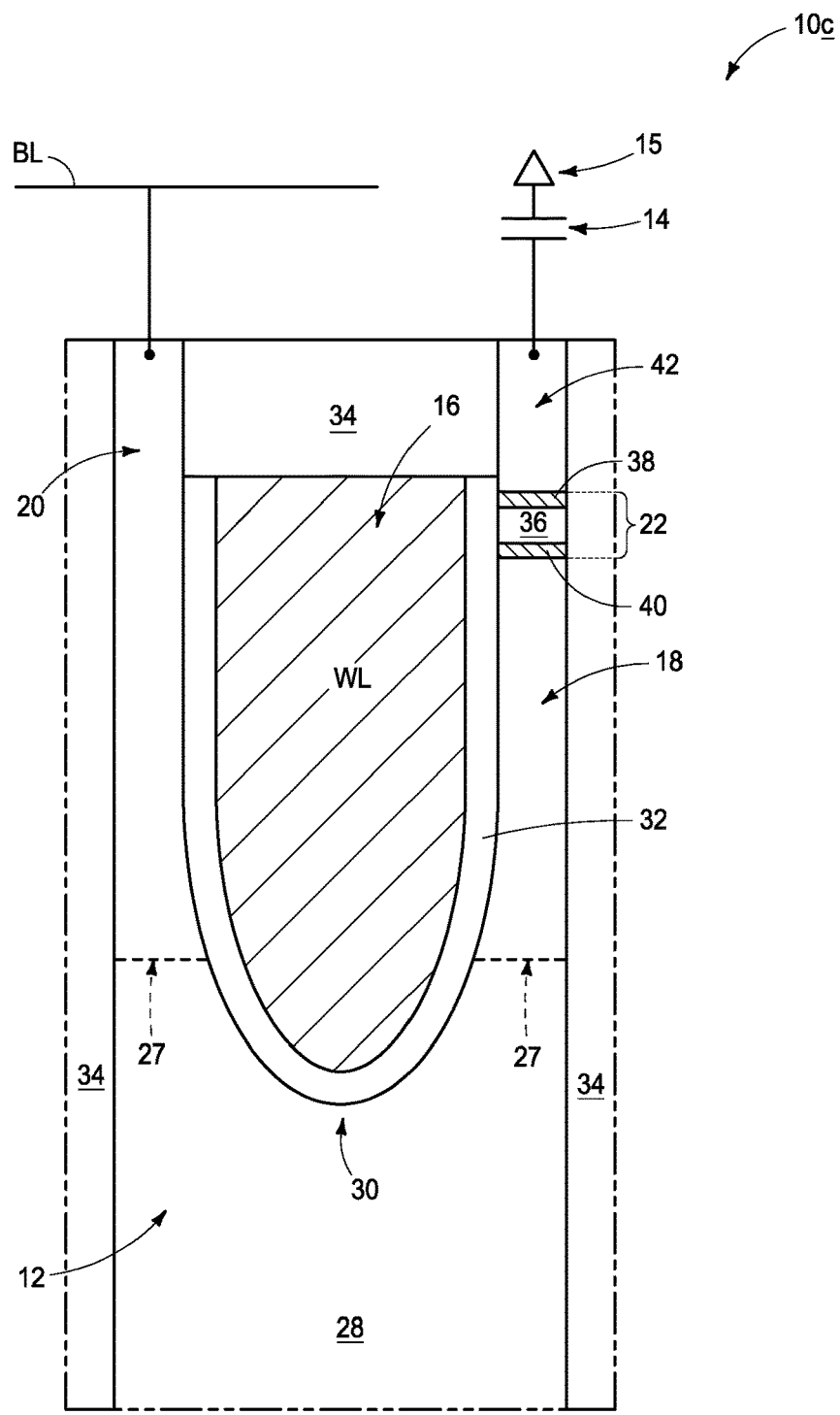
FIGS. 4-10 are diagrammatic cross-sectional side views of example memory cells.

Referring to FIG. 4, a memory cell 10c includes a transistor 12 electrically coupled with a charge-storage device 14 (which is shown as a capacitor in the illustrated embodiment). The transistor 12 includes a gate 16 and a pair of source/drain regions 18 and 20. The source/drain region 18 is electrically coupled to the charge-storage device 14 through a controlled-conductivity region 22. The source/drain region 20 is electrically coupled to the bitline BL.

The source/drain regions 18 and 20 are within a semiconductor material 28, and may correspond to heavily-doped regions of such semiconductor material; and in some embodiments may include metals. The source/drain regions 18 and 20 may be doped to be either p-type majority doped or n-type majority doped. Approximate lower boundaries of the source/drain regions are diagrammatically illustrated with dashed lines 27. Regions of the semiconductor material 28 above the dashed lines 27 may correspond to heavily-doped regions, and the region of the semiconductor material 28 beneath the dashed lines 27 may correspond to a less-heavily-doped region.

A channel region 30 extends between the source/drain regions 18 and 20, and in the shown embodiment extends under the transistor gate 16. The channel region 30 may correspond to a region of semiconductor material 28 appropriately doped with threshold-voltage dopant.

The semiconductor material 28 may comprise any suitable material, and in some embodiments may comprise, consist essentially of, or consist of silicon. The silicon may be in any suitable form, and may correspond to, for example, monocrystalline silicon, polycrystalline silicon, etc. The semiconductor material 28 may be comprised by a semiconductor base, or may be over a semiconductor base. The base may, for example, comprise, consist essentially of, or consist of monocrystalline silicon. The base may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base may correspond to a semiconductor substrate containing one or more materials associated with integrated circuit fabrication. Such materials may include, for example, one or more of refractory metal materials, barrier materials, diffusion materials, insulator materials, etc.

The gate 16 is spaced from semiconductor material 28 by gate dielectric 32. The gate dielectric 32 may comprise any suitable composition or combination of compositions; and in some embodiments may comprise, consist essentially of, or consist of silicon dioxide.

In the illustrated embodiment, the gate 16 is recessed into semiconductor material 28; and in such embodiment the transistor 12 may be referred to as a recessed transistor, or as a recessed access device (RAD). The gate 16 may be part of a wordline WL extending in and out of the page relative to the cross-section of FIG. 4. The gate 16 may include any suitable composition or combination of compositions, and in some embodiments may include one or more metals or metal-containing compositions (e.g., metal silicide, metal nitride, metal carbide, etc.).

Insulative material 34 is provided along the sides of transistor 12 to electrically isolate the transistor from other structures (not shown), and is provided over the recessed gate 16. The insulative material 34 may comprise any suitable composition or combination of compositions; including, for example, one or more of silicon dioxide, silicon nitride, etc. Although the same insulative material 34 is shown provided over gate 16 as is provided along the sides of transistor 12, in other embodiments the insulative material over the gate may be of a different composition relative to the insulative material provided along the sides of the transistor.

The controlled-conductivity region 22 comprises a material 36 between a pair of electrodes 38 and 40; and such material 36 may be referred to as a controlled-conductivity material. In some embodiments, the controlled-conductivity material 36 may comprise, consist essentially of, or consist of one or more of silicon (for instance, undoped amorphous silicon), silicon carbide, chalcogenide, tungsten sulfide, tungsten silicide, molybdenum sulfide, molybdenum silicide, and indium gallium zinc oxide. The material 36 may additionally, or alternatively, comprise one or more doped oxides.

The controlled-conductivity material 36 may have any suitable thickness between the electrodes 38 and 40, and in some embodiments may have a thickness within a range of from at least one monolayer to less than or equal to about 40 nm.

The electrodes 38 and 40 may comprise a same composition as one another, or may comprise different compositions relative to another. The electrodes 38 and 40 may comprise any suitable electrically conductive materials, such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the electrodes 38 and 40 comprise heavily-doped regions of semiconductor material 28 identical to the heavily-doped source/drain region 18. In some embodiments, the electrodes 38 and 40 are metal-containing materials.

A conductive region 42 extends between the electrode 38 and charge-storage device 14. In some embodiments, the conductive region 42 may comprise semiconductor material 28 doped identically to the heavily-doped source/drain region 18. In other embodiments, the conductive region 42 may comprise other suitable conductive materials, such as, for example, metal-containing materials. In some embodiments, the region 42 may simply be an extension of the electrode 38, and may comprise a same composition as the electrode 38.

In some embodiments, the channel region 30 may be considered to comprise a first material having a first bandgap (for instance, may comprise silicon or other suitable semiconductor material doped to a threshold voltage level with suitable dopant), and the material 36 of the controlled-conductivity region may be considered to comprise a second material having a second bandgap. In some embodiments, it may be desirable for the second bandgap to be greater than the first bandgap in order to achieve a desired relationship of current flow through the controlled-conductivity region 22 as compared to the current flow across channel region 30. Specifically, it may be desired that the conductivity across the controlled-conductivity region 22 be at least equal to that across channel region 30 (and preferably greater than that across channel region 30), at least when the controlled-conductivity region is in the high-conductivity mode. In some cases, controlled-conductivity region 22 may have a conductivity greater than channel region 30 by at least about 10-times, at least about 100-times, etc.

The memory cell 10c of FIG. 4 may be considered to be an example of the memory cell 10b schematically illustrated in FIG. 3. Specifically, the controlled-conductivity region 22 is in operational proximity to the gate 16 such that an electrical field generated by voltage along the gate may be utilized to switch the controlled-conductivity region 22 between the high and low-conductivity modes.

In some embodiments, the controlled-conductivity region 22 may be utilized to enhance current flow from/to charge-storage device 14 during reading/writing operations. It may be desired that current flow from the charge-storage device 14 be equally unimpeded relative to current flow to the charge-storage device 14; or, in other words, that current flow from the charge-storage device 14 be symmetric relative to current flow to the charge-storage device 14. In some applications, the material 36 within the controlled-conductivity region 22 may exhibit snap-back type behavior. Specifically, current-versus-voltage behavior of the material 36 may be such that current flow through the material may extend along either of two paths, with such paths being exchanged at particular voltages. Snap-back behavior is described in detail in U.S. Pat. No. 9,263,675. It may be acceptable to have a device with snap-back with respect to bias applied across electrodes 38 and 40. In fact, it may be useful for the device to have big snapback with respect to voltage across electrodes 38 and 40. However, an ideal device for controlled-conductivity region 22 may be one which, after threshold, continues to stay in a high-conductivity state as long as the gate field is high. As soon as the gate field is turned off the controlled-conductivity region 22 turns off (gate-assisted) abruptly. Thus, there is no snap back with respect to gate voltage. This ensures even at low source/drain bias, the controlled-conductivity region 22 is in a high-conductivity state and hence doesn't cause degradation in current flowing to storage, and hence no degradation in speed, and in off-state the device turns off when the gate is Off. In some embodiments, voltage across the electrodes 38 and 40 may exhibit snap-back behavior during operation of the controlled-conductivity region 22 such that conductivity across the controlled-conductivity material 36 remains higher than conductivity across the channel region even if bias between the first and second source/drain regions 18 and 20 is low (e.g., less than or equal to about 50 mV).

Figure 5:
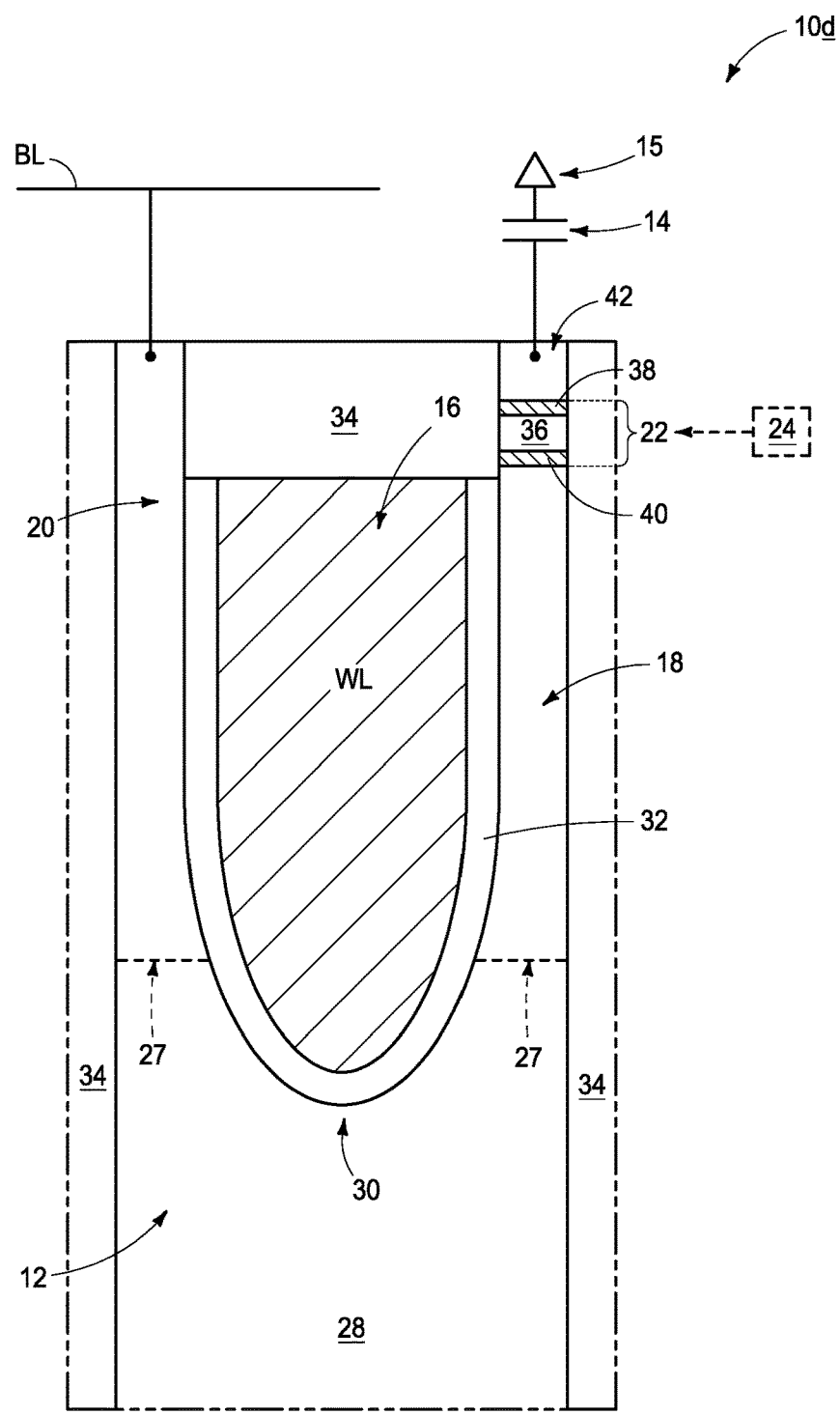

FIG. 5 illustrates another example memory cell 10d. The memory cell 10d of FIG. 5 is similar to the memory cell 10c of FIG. 4, except that the controlled-conductivity region 22 of memory cell 10*d* is not gated by the gate 16. Accordingly, the memory cell 10*d* of FIG. 5 is analogous to the memory cell 10 described above with reference to FIG. 1.

The various materials of memory cell 10*d* of FIG. 5 may be the same as those described above relative to the memory cell 10*c* of FIG. 4. The controlled-conductivity region 22 may switch from the low-conductivity mode to the high-conductivity mode due to changes in ionization, temperature, etc. upon being exposed to an electrical bias. Alternatively, an electrical component 24 (analogous that described above with reference to FIG. 2) may be optionally provided proximate the controlled-conductivity region 22 and utilized to induce a switch between a high-conductivity mode and a low-conductivity mode. The electrical component 24 may be a heater utilized to induce a temperature change and/or phase change within the material 36 of the controlled-conductivity region, or may be any other suitable configuration which induces a change within the material 36 sufficient to lead to switching between the high-conductivity mode and the low-conductivity mode. The component 24 is diagrammatically illustrated in dashed-line in FIG. 5 to indicate that such component is optional, and a dashed-line arrow is provided adjacent the optional component 24 to diagrammatically illustrate the influence from component 24 on the controlled-conductivity region 22.

In some applications, the controlled-conductivity region 22 of FIG. 5 may be considered to be a two-terminal device. The two-terminal device may include a pn diode if an n-type doped region is against a p-type doped region within such device. However, it may be desired that current flow be equally unimpeded in both directions through the device (i.e., current flow in a direction toward charge-storage device 14 be equally unimpeded relative to current flow in a direction from charge-storage device 14). Accordingly, it may be desired that the controlled-conductivity region 22 operate differently than a diode.

Figure 6:
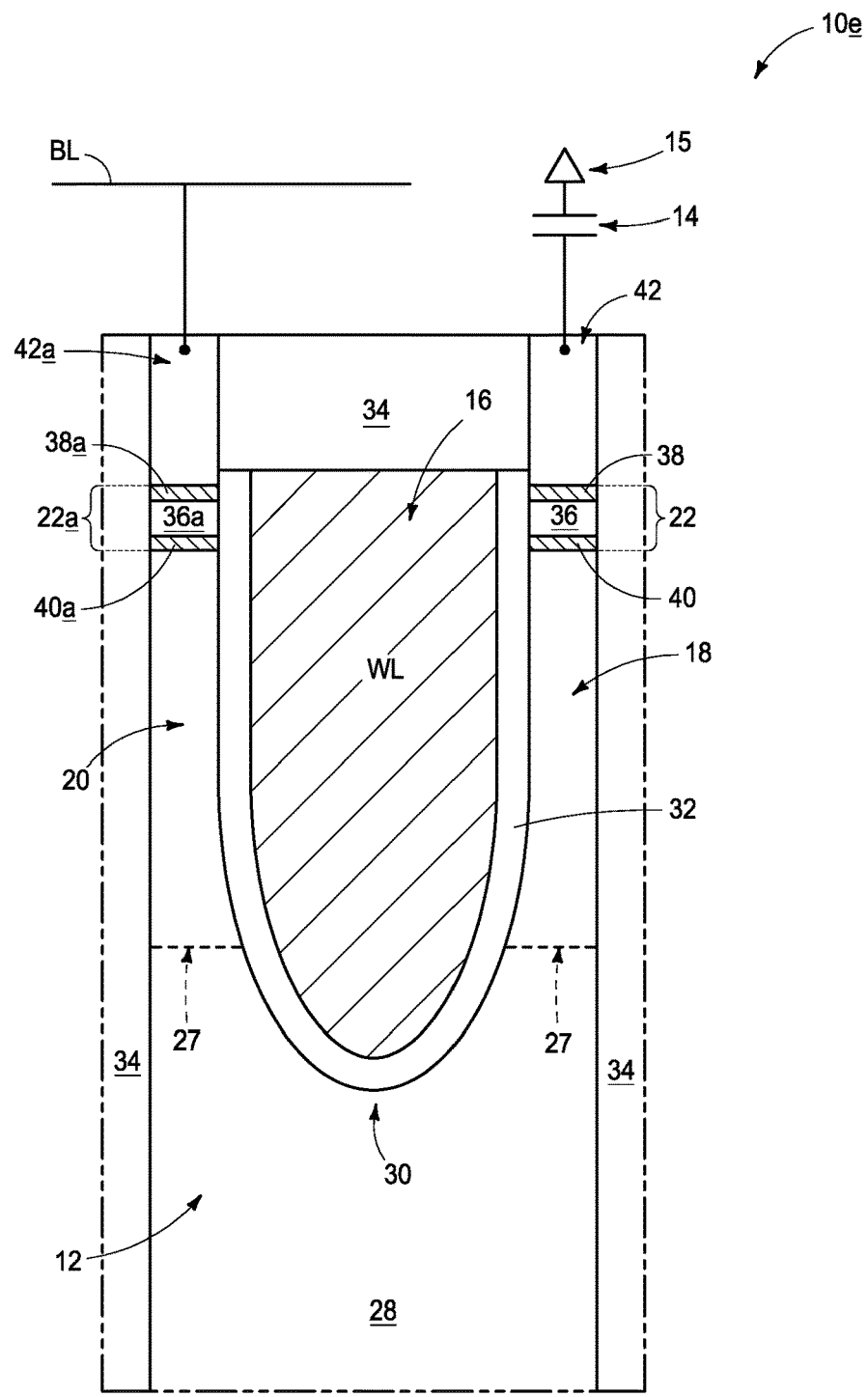

FIG. 6 illustrates another example memory cell 10*e*. The memory cell 10*e* of FIG. 6 is similar to the memory cell 10*c* of FIG. 4, except that a second controlled-conductivity region 22*a* is provided within the memory cell 10*e*. The second controlled-conductivity region 22*a* is provided between the second source/drain region 20 and the bitline BL. The second controlled-conductivity region 22*a* comprises material 36*a* and electrodes 38*a* and 40*a*. The material 36*a* of the second controlled-conductivity region 22*a* may be identical to the material 36 of the first controlled-conductivity region 22, and the electrodes 38*a*/40*a* of the second controlled-conductivity region 22*a* may be identical to the electrodes 38/40 of the first controlled-conductivity region 22.

Conductive material 42*a* is provided between the second controlled-conductivity region 22*a* and the bitline BL. The conductive material 42*a* may be identical to the conductive material 42 provided between the first controlled-conductivity region 22 and the charge-storage device 14.

The second controlled-conductivity region 22*a* may be provided to simplify fabrication of the memory cell. Specifically, it may be advantageous to provide controlled-conductivity regions within both of the source/drain regions 18/20 of transistor 12 instead of within only the single source/drain region 18 in order to simplify masking and/or other processing. In some applications, the controlled-conductivity region 22 on the charge-storage device side of transistor 12 (i.e., within the source/drain region 18 adjacent charge-storage device 14) provides substantial operational advantages relative to prior art memory cells in reducing leakage, improving uniformity, etc. (with such advantages having been discussed above with reference to FIGS. 1-3), and the controlled-conductivity region 22*a* on the bitline side (i.e., within the source/drain region 20 adjacent the bitline BL) provides few if any operational advantages. However, in some applications, the controlled-conductivity region 22*a* on the bitline side of the transistor 12 may provide at least some operational advantages, (such as improved uniformity, etc.) analogous to those described above with reference to the controlled-conductivity region 22 provided on the charge-storage device side of the transistor 12.

The various materials of memory cell 10*e* of FIG. 6 may be the same as those described above relative to the memory cell 10*c* of FIG. 4.

Figure 7:
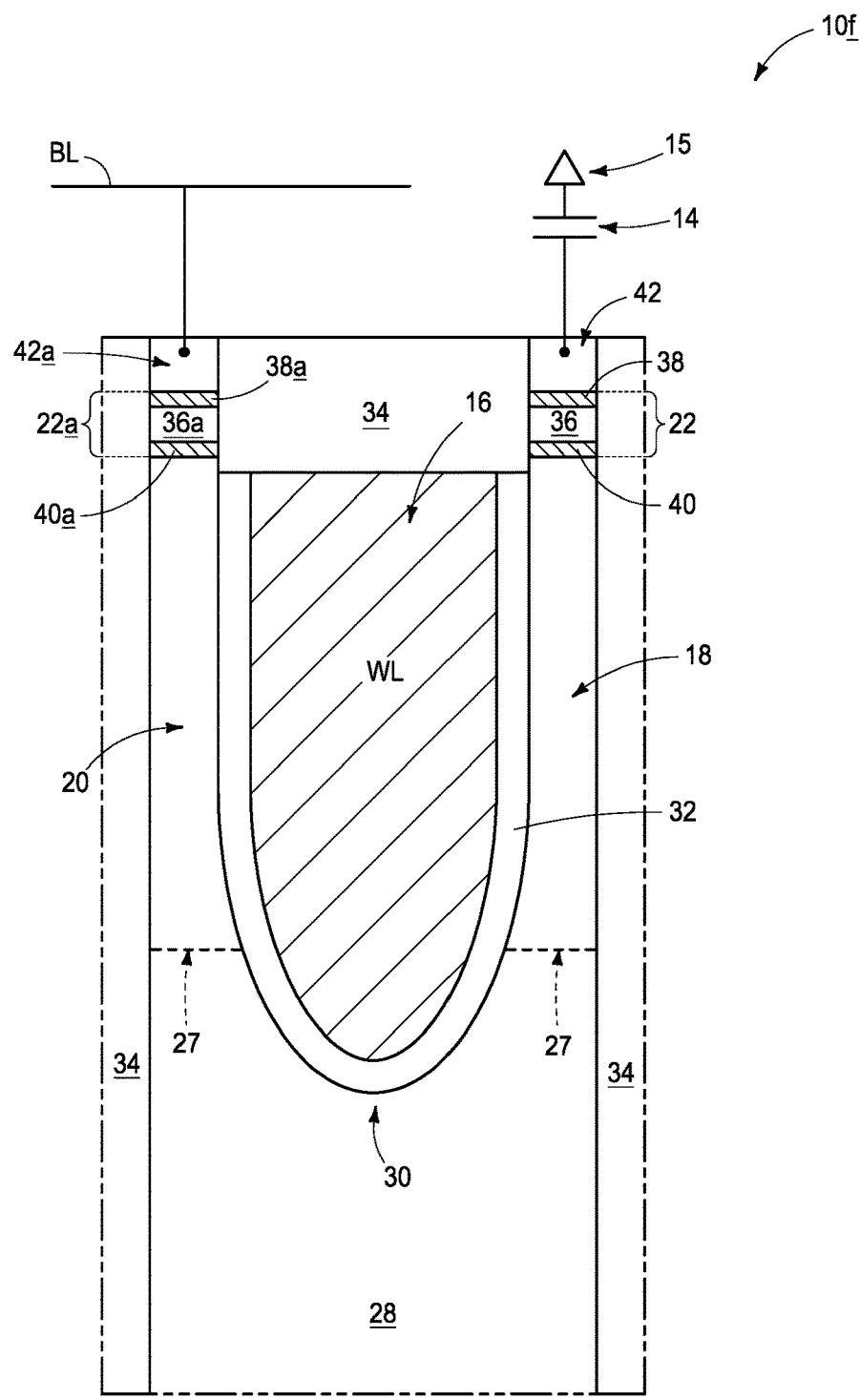

FIG. 7 illustrates another example memory cell 10*f*. The memory cell 10*f* of FIG. 7 is similar to the memory cell 10*d* of FIG. 5, except that a second controlled-conductivity region 22*a* is provided within the memory cell 10*f*. The various materials of memory cell 10*f* of FIG. 7 may be the same as those described above relative to the memory cell 10*d* of FIG. 5. The second controlled-conductivity region 22*a* of FIG. 7 may be provided to simplify processing, as described above with reference to FIG. 6. The second controlled-conductivity region 22*a* of FIG. 7 may or may not provide operational advantages, for reasons analogous to those discussed above regarding the second controlled-conductivity region 22*a* of FIG. 6.

Figures 8, 9:
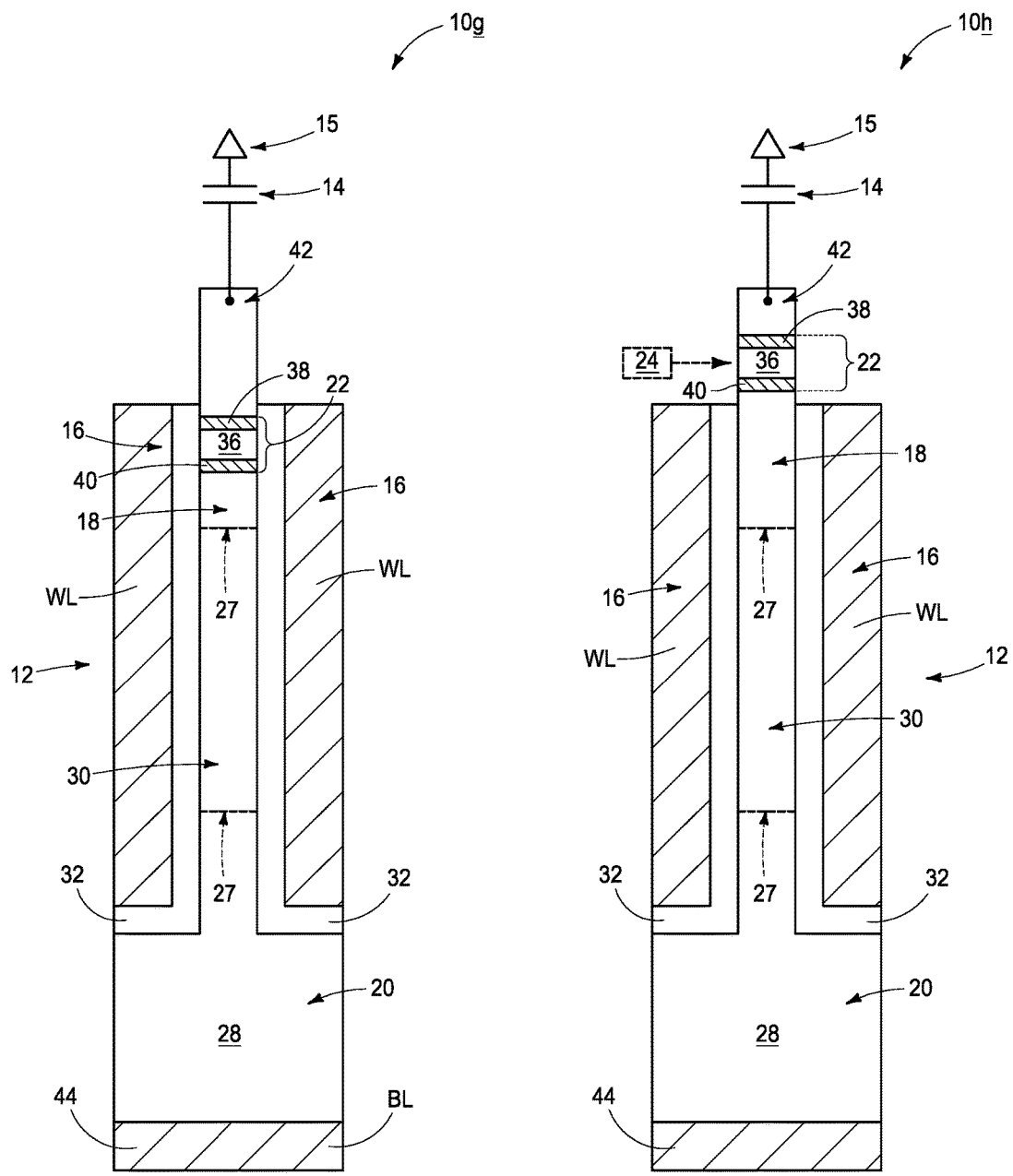

FIG. 8 illustrates another example memory cell 10*g*. The memory cell 10*g* of FIG. 8 is similar to the memory cell 10*c* of FIG. 4, except that the transistor of FIG. 8 is configured to include a pedestal of semiconductor material 28 extending over a buried bitline BL. The various materials of memory cell 10*g* of FIG. 8 may be the same as those described above relative to the memory cell 10*c* of FIG. 4. The buried bitline BL comprises conductive material 44. The conductive material 44 may comprise any suitable electrically conductive composition(s), such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.).

The memory cell 10*g* of FIG. 8 has the charge-storage structure 14 (illustrated as a capacitor) over the bitline BL, has a pedestal of semiconductor material 28 extending between the bitline BL and the charge-storage device 14, and has the transistor gate 16 extending along the opposing sides of the pedestal of semiconductor material 28. The source/drain region 18 is along an upper portion of the pedestal of semiconductor material 28, and the source/drain region 20 is along a lower portion of the pedestal of semiconductor material 28. The channel region 30 is between the source/drain regions 18 and 20. The controlled-conductivity region 22 is between the source/drain region 18 and the charge-storage device 14, and is gated by the transistor gate 16.

FIG. 9 illustrates an example memory cell 10*h* similar to the memory cell 10*g* of FIG. 8, but having the controlled-conductivity region 22 provided above the gate 16 so that the controlled-conductivity region 22 is not gated by the gate 16. The memory cell 10*h* of FIG. 9 is analogous to the memory cell 10*d* of FIG. 5. The optional component 24 (described above with reference to FIG. 5) is diagrammatically illustrated in dashed-line view in FIG. 9, and a dashed-line arrow is provided adjacent the optional component 24 to diagrammatically illustrate the optional influence from component 24 on the controlled-conductivity region 22.

Figure 10:
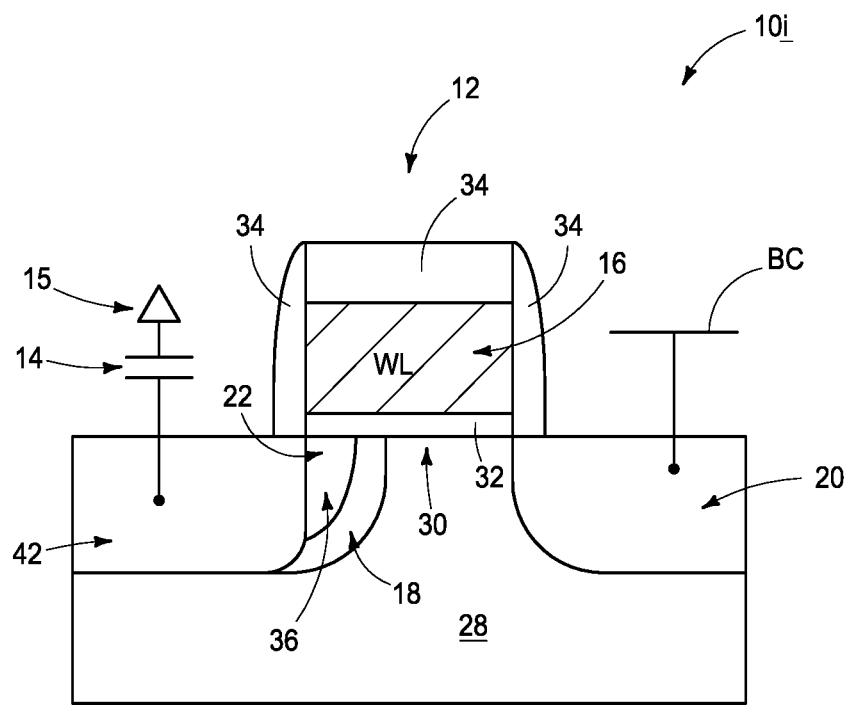

FIG. 10 illustrates another example memory cell 10i. The memory cell 10i of FIG. 10 is similar to the memory cell 10c of FIG. 4, except that the transistor of FIG. 10 is configured as a planar transistor. The various materials of memory cell 10i of FIG. 10 may be the same as those described above relative to the memory cell 10c of FIG. 4. The source/drain region 18 is beneath gate 16 of FIG. 10. The controlled-conductivity region 22 is between the source/drain 18 and the charge-storage device 14, and is gated by the transistor gate 16. The electrodes 38/40 (FIG. 4) of the controlled-conductivity region 22 are not shown in FIG. 10. Such electrodes may correspond to heavily-doped regions of semiconductor material 28; with one of the heavily-doped regions being on one side of the controlled-conductivity region 22 and corresponding to a portion of the source/drain region 18, and with the other of the heavily-doped regions being on another side of the controlled-conductivity region 22 and corresponding to a portion of the conductive region 42. In other embodiments (not shown) one or more metal-containing electrodes may be included within the controlled-conductivity region 22 of FIG. 10.

Figure 11:
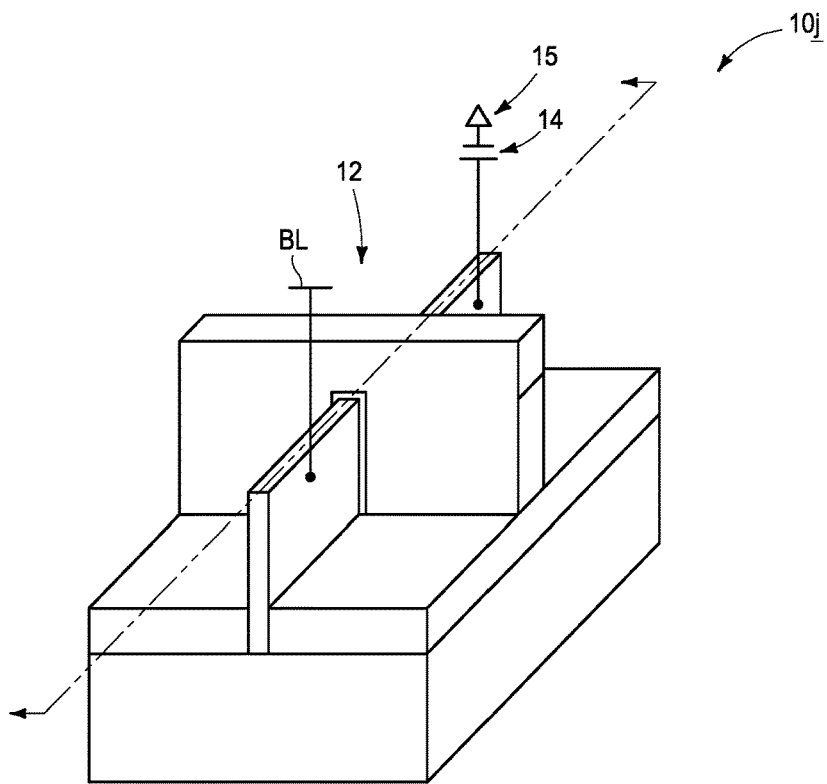
FIG. 11 is a diagrammatic three-dimensional view of an example memory cell.
Figure 12:
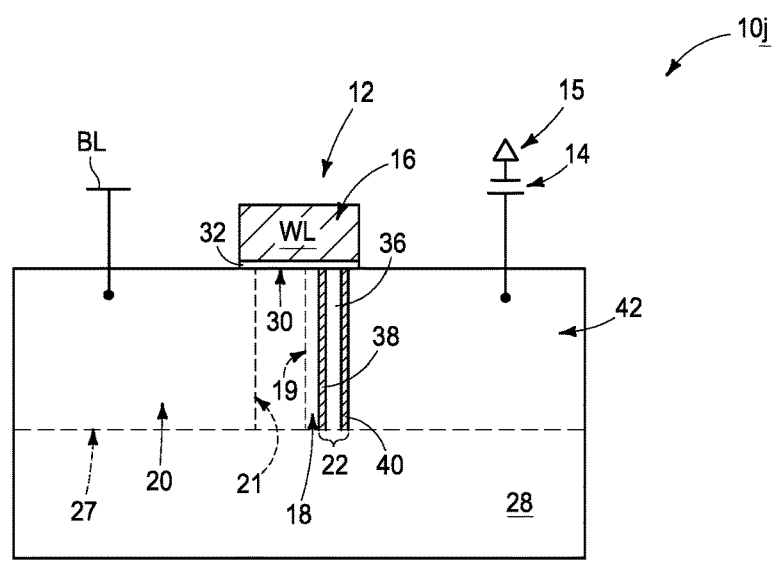
FIGS. 12 and 13 are diagrammatic cross-sectional side views along the line A-A of FIG. 11 illustrating example memory cell configurations.

FIGS. 11 and 12 illustrate another example memory cell 10j; with the view of FIG. 12 being along the line A-A of FIG. 11. The memory cell 10j of FIGS. 11 and 12 is similar to the memory cell 10c of FIG. 4, except that the transistor of FIGS. 11 and 12 is configured as a finFET transistor. The various materials of memory cell 10j of FIGS. 11 and 12 may be the same as those described above relative to the memory cell 10c of FIG. 4. Dashed-lines 19 and 21 are provided to diagrammatically illustrate approximate boundaries between the source/drain regions 18 and 20 and the channel region 30.

The source/drain region 18 is beneath gate 16 of FIGS. 11 and 12. The controlled-conductivity region 22 is between the source/drain 18 and the charge-storage device 14, and is gated by the transistor gate 16. The electrodes 38/40 of the controlled-conductivity region 22 of FIGS. 11 and 12 may correspond to heavily-doped regions of semiconductor material 28; with one of the heavily-doped regions corresponding to a portion of the source/drain region 18, and with the other of the heavily-doped regions corresponding to a portion of the conductive region 42. Alternatively, one or both of the electrodes 38/40 of FIGS. 10 and 11 may be a metal-containing electrode.

Figure 13:
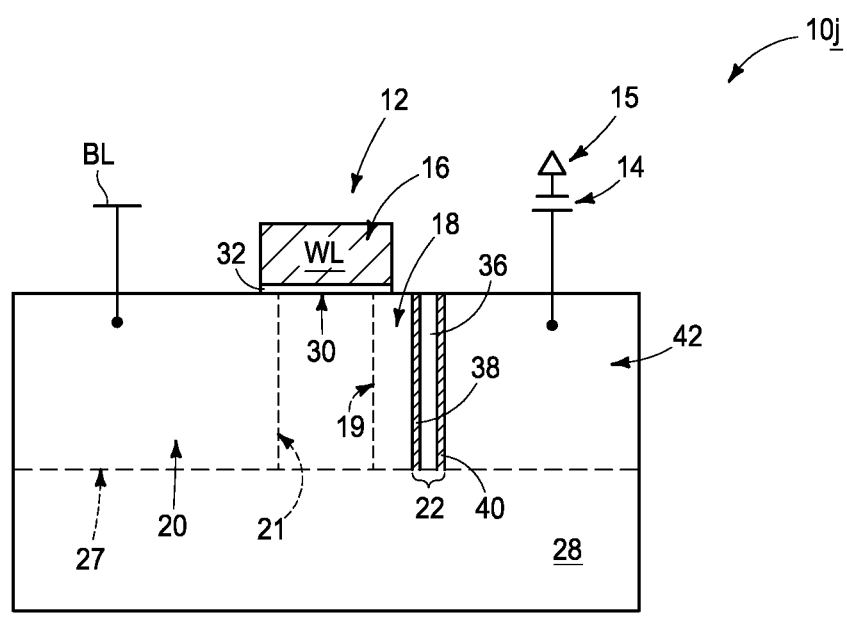

FIG. 13 shows an arrangement of the memory cell 10j alternative to that of FIG. 12. Specifically, the controlled-conductivity region 22 is not gated by the transistor gate 16. The memory cell 10j of FIG. 13 is analogous to the memory cell 10d of FIG. 5. The optional component 24 (described above with reference to FIG. 5) is not shown in FIG. 13, but may be provided in some embodiments.

Figure 14:
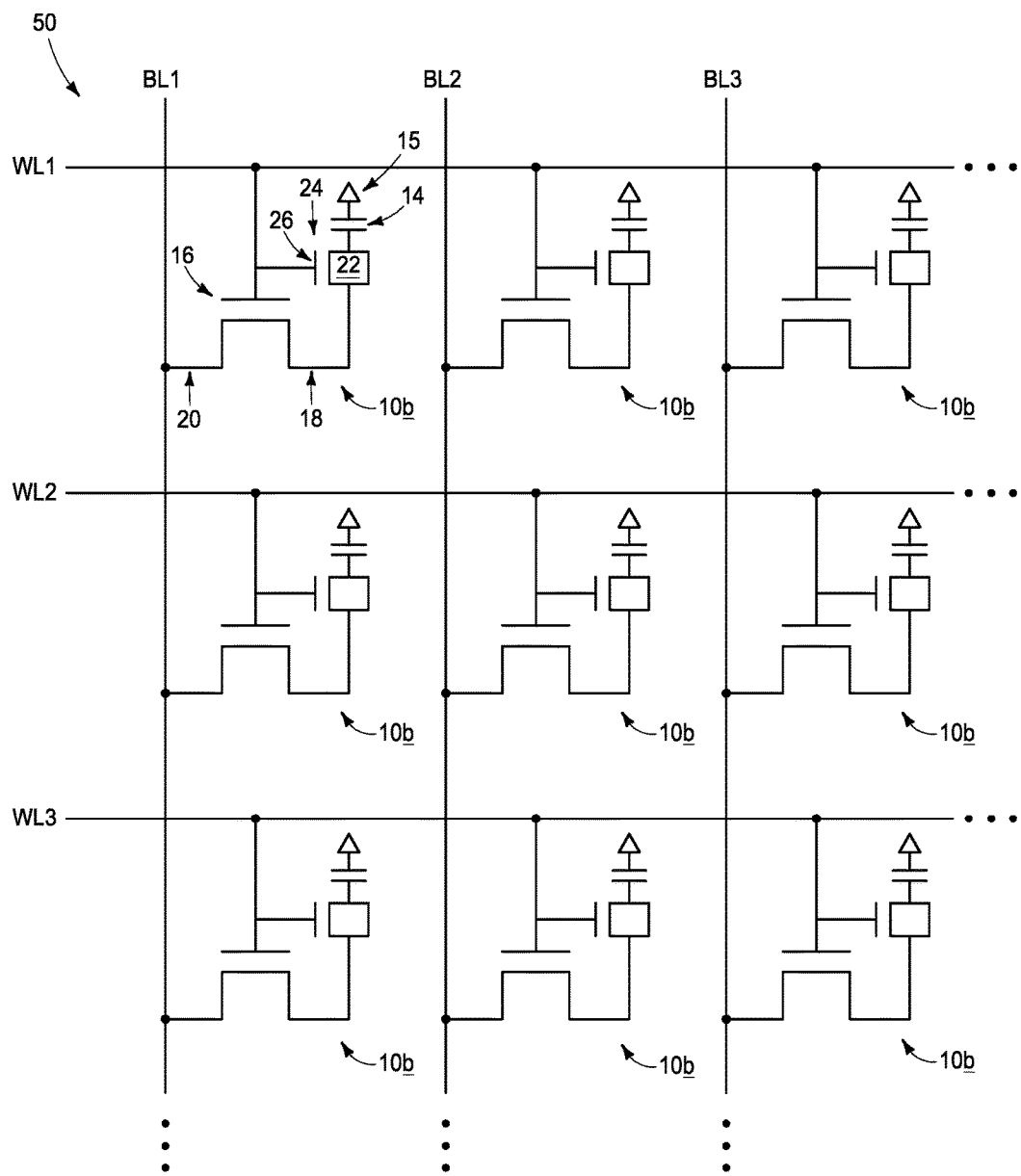
FIG. 14 is a diagrammatic schematic view of an example memory array comprising example memory cells.

The memory cells described herein may be incorporated into memory arrays. An example memory array 50 is shown in FIG. 14, with such memory array comprising memory cells 10b of the type described above with reference to FIG. 3. The memory array 50 includes a series of wordlines (WL1, WL2 and WL3) and a series of bitlines (BL1, BL2 and BL3). Each memory cell 10b is uniquely addressed by a bitline and a wordline. Although memory cells 10b are illustrated, in other embodiments analogous memory arrays may be fabricated to comprise the memory cells 10 of FIG. 1, or the memory cells 10a of FIG. 2.

Figure 15:
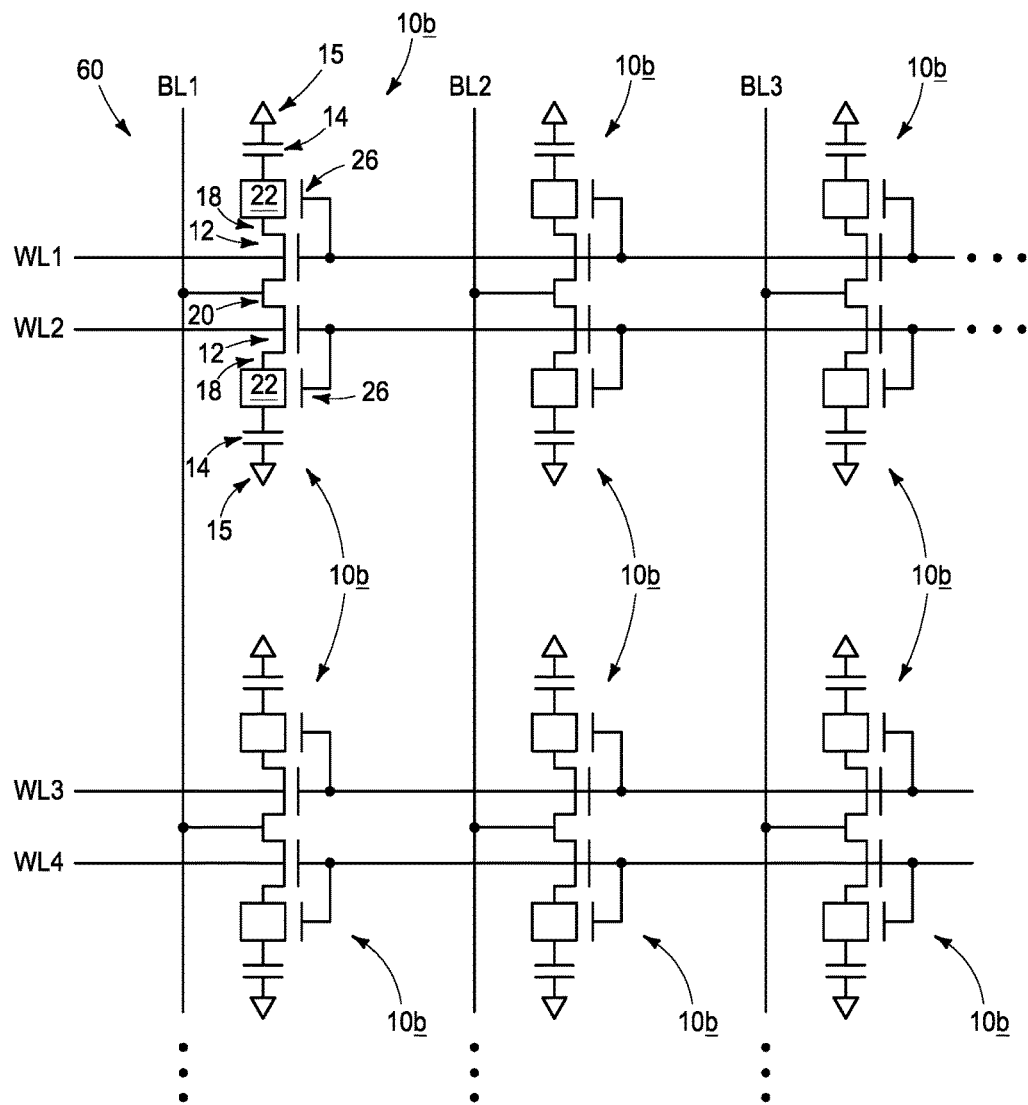
FIG. 15 is a diagrammatic schematic view of an example memory array comprising example memory cells.

FIG. 15 illustrates another example memory array 60 comprising memory cells 10b of the type described above with reference to FIG. 3. The memory array 60 is similar to the memory array 50 described above with reference to FIG. 14, except that bitlines (BL1, BL2 and BL3) are shared by paired memory cells. Although memory cells 10b are illustrated, in other embodiments analogous memory arrays may be fabricated to comprise the memory cells 10 of FIG. 1, or the memory cells 10a of FIG. 2.

In some embodiments, the memory arrays 50 and 60 of FIGS. 14 and 15 may be DRAM arrays.

In some embodiments, the controlled-conductivity regions 22 described herein may influence the electrical flow to/from the charge-storage device 14 of a memory cell (e.g., cells 10-10j of FIGS. 1-13) enough that uniformity across the controlled-conductivity regions of a memory array can mask non-uniformity which may be present amongst other components of the memory cells. It may be easier to form the controlled-conductivity regions to have uniform performance characteristics across the memory array than it is to form other components of the memory cells to have the uniform performance characteristics. Accordingly, the controlled-conductivity regions 22 can improve uniformity of performance across the memory cells of the memory array. Further, the controlled-conductivity regions may advantageously offer greater improvement for poorer-performing memory cells as compared to better-performing memory cells (e.g., may offer greatest improvement of retention time for the memory cells that otherwise would have the lowest retention times), and may thus improve the overall properties of a memory array (such as, for example, refresh rate) by improving the properties of the more-problematic memory cells of the array.

In some embodiments, the controlled-conductivity regions 22 described herein may influence the electrical flow to/from the charge-storage device 14 of a memory cell (e.g., cells 10-10j of FIGS. 1-13) enough to compensate for defects that are cloaked during testing and yet alter device performance characteristics in actual use. Specifically, the incorporation of the controlled-conductivity regions 22 into the memory cells may alter electrical characteristics of the memory cells in a manner which forces otherwise cloaked defects to reveal themselves during testing of the memory cells, and/or the incorporation of the controlled-conductivity regions 22 into the memory cells may alter electrical characteristics of the memory cells in a manner which renders the cloaked defects immaterial to later performance of the memory cells in actual use.

The memory cells and arrays discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Some embodiments include a memory cell having a transistor with a channel region between a first source/drain region and a second source/drain region. A controlled-conductivity region is adjacent the first source/drain region. The controlled-conductivity region has a low-conductivity mode and a high-conductivity mode. The high-conductivity mode has a conductivity at least $10^6$ greater than a conductivity of the low-conductivity mode. The channel region includes a first material having a first bandgap, and the controlled-conductivity region includes a second material having a second bandgap which is greater than the first bandgap. In some embodiments, the bandgap within the controlled-conductivity region may not be uniform, and may vary spatially. A charge-storage device is electrically coupled to the first source/drain region through the controlled-conductivity region. A bitline is electrically coupled to the second source/drain region.

Some embodiments include a memory cell comprising a transistor having a channel region between a pair of source/drain regions, and having a transistor gate along the channel region. A controlled-conductivity region is adjacent one of the source/drain regions. The controlled-conductivity region has a high-conductivity mode and a low-conductivity mode. The high-conductivity mode has a conductivity at least $10^3$ greater than a conductivity of the low-conductivity mode. The gate extends along the controlled-conductivity region in operational proximity to the controlled-conductivity region so that an electrical field from the gate switches the controlled-conductivity region between the high and low-conductivity modes. A charge-storage device is electrically coupled to said one of the source/drain regions through the controlled-conductivity region.

Some embodiments include a memory cell comprising a transistor having a channel region between a first source/drain region and a second source/drain region, and having a transistor gate along the channel region. A controlled-conductivity region is adjacent the first source/drain region. The controlled-conductivity region has a high-conductivity mode and a low-conductivity mode. The high-conductivity mode has a conductivity at least $10^6$ greater than a conductivity of the low-conductivity mode. The controlled-conductivity region comprises controlled-conductivity material which includes, for example, silicon, silicon carbide, chalcogenide, tungsten sulfide, tungsten silicide, molybdenum sulfide, molybdenum silicide, indium gallium zinc oxide, etc.; and may include any of the listed materials singly or in any suitable combination. The gate extends along the controlled-conductivity region in operational proximity to the controlled-conductivity region so that an electrical field from the gate switches the controlled-conductivity region between the high and low-conductivity modes. A capacitor is electrically coupled to the first source/drain region through the controlled-conductivity region. A bitline is electrically coupled to the second source/drain region.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A memory cell, comprising:
 a transistor having a channel region between a first source/drain region and a second source/drain region; the transistor having a transistor gate extending along the channel region;
 a controlled-conductivity region adjacent the first source/drain region, the controlled-conductivity region being along a surface of the transistor gate and separated from the surface of the transistor gate by a dielectric material, the controlled-conductivity region being gated by said transistor gate; the controlled-conductivity region having a low-conductivity mode and a high-conductivity mode; the high-conductivity mode having a conductivity at least $10^6$ greater than a conductivity of the low-conductivity mode; the channel region comprising a first material having a first bandgap, and the controlled-conductivity region comprising a second material having a second bandgap which is greater than the first bandgap; an insulative material over an upper surface of the transistor gate, and a conductive region over the controlled-conductivity region and along the insulative material;
 a charge-storage device electrically coupled to the first source/drain region through the controlled-conductivity region; and
 a bitline electrically coupled to the second source/drain region.

2. The memory cell of claim 1 wherein the controlled-conductivity region includes a controlled conductivity material selected from the group consisting of silicon, silicon carbide, chalcogenide, tungsten sulfide, tungsten silicide, molybdenum sulfide, molybdenum silicide, indium gallium zinc oxide, and mixtures thereof.

3. The memory cell of claim 2 wherein the controlled-conductivity material is between a pair of electrodes, and wherein a voltage across the electrodes exhibits snap-back behavior during operation of the controlled-conductivity region.

4. The memory cell of claim 1 wherein the controlled-conductivity region is switched between the high and low-conductivity modes utilizing an electrical component adjacent the controlled-conductivity region.

5. The memory cell of claim 1 wherein the controlled-conductivity region is switched between the high and low-conductivity modes utilizing an electrical field extending into the controlled-conductivity region.

6. The memory cell of claim wherein the controlled-conductivity region is a first controlled-conductivity region, and wherein a second controlled-conductivity region is between the second source/drain region and the bitline.

7. A memory cell, comprising:
- a transistor having a channel region between a pair of source/drain regions within a substrate material, and having a transistor gate along the channel region, the transistor gate having a lowest region extending within the channel region and having sidewalks extending vertically above the channel region, the transistor gate being spaced from the substrate material along the lowest region and sidewalk by an intervening dielectric material;
- an insulative material over an upper surface of the transistor gate;
- a controlled-conductivity region adjacent and physically contacting one of the source/drain regions; the controlled-conductivity region having a high-conductivity mode and a low-conductivity mode; the high-conductivity mode having a conductivity at least $10^3$ greater than a conductivity of the low-conductivity mode; the gate extending along the controlled-conductivity region in operational proximity to the controlled-conductivity region so that an electrical field from the gate switches the controlled-conductivity region between the high and low-conductivity modes;
- a conductive region over the controlled-conductivity region and along the insulative material; and
- a charge-storage device electrically coupled to said one of the source/drain regions through the controlled-conductivity region.

8. The memory cell of claim 7 wherein the conductivity of the high-conductivity mode is at least $10^6$ greater than the conductivity of the low-conductivity mode.

9. The memory cell of claim 7 wherein the conductivity of the high-conductivity mode is at least $10^9$ greater than the conductivity of the low-conductivity mode.

10. The memory cell of claim 7 wherein a voltage on the gate and utilized to generate the electric field that switches the controlled-conductivity region between the high and low-conductivity modes is less than or equal to about 3 volts.

11. The memory cell of claim 7 wherein a voltage on the gate and utilized to generate the electric field that switches the controlled-conductivity region between the high and low-conductivity modes is less than or equal to about 1 volt.

12. The memory cell of claim 7 wherein a voltage on the gate and utilized to generate the electric field that switches the controlled-conductivity region between the high and low-conductivity modes is less than or equal to about 50 millivolts.

13. The memory cell of claim 7 wherein the controlled-conductivity region includes one or more of silicon, silicon carbide, chalcogenide, tungsten sulfide, tungsten silicide, molybdenum sulfide, molybdenum silicide, and indium gallium zinc oxide; and wherein the channel region includes doped silicon.

14. A memory cell, comprising:
- a recessed transistor having a channel region between a first source/drain region and a second source/drain region, and having a transistor gate along the channel region and extending upwardly between the first and second source/drain regions, the transistor gate having an uppermost surface and being spaced from the first and second source/drain regions by a dielectric material along sidewalls of the transistor gate;
- a controlled-conductivity region adjacent the first source/drain region; the controlled-conductivity region having a high-conductivity mode and a low-conductivity mode; the high-conductivity mode having a conductivity at least $10^6$ greater than a conductivity of the low-conductivity mode; the controlled-conductivity region comprising controlled-conductivity material which includes one or more of silicon, silicon carbide, chalcogenide, tungsten sulfide, tungsten silicide, molybdenum sulfide, molybdenum silicide, and indium gallium zinc oxide; the gate extending along the controlled-conductivity region in operational proximity to the controlled-conductivity region so that an electrical field from the gate switches the controlled-conductivity region between the high and low-conductivity modes;
- a conductive region over the controlled-conductivity region and extending to an elevation above an elevation of, the uppermost surface of the transistor gate;
- a capacitor electrically coupled to the first source/drain region through the controlled-conductivity region; and
- a bitline electrically coupled to the second source/drain region.

15. The memory cell of claim 14 wherein the controlled-conductivity region includes a pair of conductive electrodes; and wherein the controlled-conductivity material is between the conductive electrodes.

16. The memory cell of claim 15 wherein the conductive electrodes comprise metal.

17. The memory cell of claim 15 wherein the conductive electrodes comprise conductively-doped semiconductor material.

* * * * *